(12) United States Patent
Lin

(10) Patent No.: US 10,085,361 B2
(45) Date of Patent: Sep. 25, 2018

(54) ELECTRICAL DEVICE HEAT DISSIPATION STRUCTURE

(71) Applicant: LOTES CO., LTD, Keelung (TW)

(72) Inventor: Chin Chi Lin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/646,561

(22) Filed: Jul. 11, 2017

(65) Prior Publication Data

US 2018/0014430 A1    Jan. 11, 2018

(30) Foreign Application Priority Data

Jul. 11, 2016 (CN) ...................... 2016 2 0719695 U

(51) Int. Cl.
| | |
|---|---|
| *H05K 7/20* | (2006.01) |
| *G06F 1/20* | (2006.01) |
| *H05K 1/02* | (2006.01) |
| *H01R 12/72* | (2011.01) |
| *H01R 12/73* | (2011.01) |

(Continued)

(52) U.S. Cl.
CPC ......... *H05K 7/20154* (2013.01); *G06F 1/203* (2013.01); *H01R 12/721* (2013.01); *H01R 12/722* (2013.01); *H01R 12/73* (2013.01); *H05K 1/0203* (2013.01); *H05K 1/148* (2013.01); *H05K 5/0247* (2013.01); *H05K 5/0286* (2013.01); *H05K 7/1427* (2013.01); *H05K 7/20145* (2013.01); *H05K 7/20436* (2013.01); *H05K 1/142* (2013.01); *H05K 1/147* (2013.01);

(Continued)

(58) Field of Classification Search
CPC .................. H01R 12/7064; H01R 12/721; H01R 12/722; H01R 12/73; H01R 13/533; H01R 13/665; H05K 7/1427; H05K 7/20145; H05K 7/20154; H05K 7/20163; H05K 7/2039; H05K 7/20436; H05K 7/20445; H05K 1/0203; H05K 1/148; H05K 5/0247; H05K 5/0286; H05K 2201/10325; H05K 2201/10356
See application file for complete search history.

(56) References Cited

U.S. PATENT DOCUMENTS

| | | | | |
|---|---|---|---|---|
| 5,768,101 | A | * 6/1998 | Cheng ................... | G06F 1/1632 361/679.41 |
| 6,058,009 | A | * 5/2000 | Hood, III ................ | G06F 1/203 361/679.47 |

(Continued)

FOREIGN PATENT DOCUMENTS

| | | |
|---|---|---|
| CN | 1983114 A | 6/2007 |
| TW | M252987 U | 12/2004 |
| TW | 201128368 A | 8/2011 |

*Primary Examiner* — Robert J Hoffberg
(74) *Attorney, Agent, or Firm* — Locke Lord LLP; Tim Tingkang Xia, Esq.

(57) ABSTRACT

An electrical device heat dissipation structure includes an air blowing device, a casing, and a mating connector. The casing is disposed with at least one air outlet, an electrical connector and a power supply. The power supply provides power to the air blowing device. The mating connector has a chip. The mating connector is electrically connected with the electrical connector. The air blowing device is configured to blow air to the mating connector through the at least one air outlet, so as to improve dissipation of heat generated by the chip at work, and to reduce a temperature of the mating connector.

19 Claims, 10 Drawing Sheets

(51) Int. Cl.
  *H05K 5/02* (2006.01)
  *H05K 7/14* (2006.01)
  *H05K 1/14* (2006.01)
(52) U.S. Cl.
  CPC ............... *H05K 7/20163* (2013.01); *H05K 2201/10325* (2013.01); *H05K 2201/10356* (2013.01)

(56) References Cited

U.S. PATENT DOCUMENTS

| | | | | |
|---|---|---|---|---|
| 6,453,378 B1 * | 9/2002 | Olson | ............... | G06F 1/1632 361/679.41 |
| 6,563,703 B2 * | 5/2003 | Xie | ............... | G06F 1/20 174/15.2 |
| 6,571,340 B1 * | 5/2003 | Lee | ............... | G06F 1/1632 700/299 |
| 6,691,197 B2 * | 2/2004 | Olson | ............... | G06F 1/1632 361/679.41 |
| 7,364,445 B1 * | 4/2008 | Ni | ............... | H05K 5/0278 439/140 |
| 7,885,062 B2 * | 2/2011 | Wagner | ............... | H05K 7/20727 361/679.49 |
| 8,000,099 B2 * | 8/2011 | Parker | ............... | G06F 1/1632 174/16.1 |
| 8,964,384 B2 * | 2/2015 | Leigh | ............... | H01L 23/4006 361/689 |
| 9,515,427 B2 * | 12/2016 | Wu | ............... | H01R 13/7175 |
| 2012/0202373 A1 * | 8/2012 | Klinghult | ............... | F04B 43/046 439/485 |
| 2017/0049004 A1 * | 2/2017 | Tsai | ............... | H02J 7/0042 |
| 2018/0014429 A1 * | 1/2018 | Ju | ............... | H01R 12/7064 |

\* cited by examiner

ELECTRICAL DEVICE HEAT DISSIPATION STRUCTURE

CROSS-REFERENCE TO RELATED APPLICATION

This non-provisional application claims priority to and benefit of, under 35 U.S.C. § 119(a), Patent Application No. 201620719695.3 filed in P.R. China on Jul. 11, 2016, the entire content of which is hereby incorporated by reference.

FIELD OF THE INVENTION

The present invention relates to an electrical device heat dissipation structure, and more particularly to an electrical device heat dissipation structure that is capable of reducing a temperature of a cable connector.

BACKGROUND OF THE INVENTION

A common cable connector in the industry includes a circuit board, a connector electrically connected to one end of the circuit board, and a flexible flat cable electrically connected to the other end of the circuit board. Currently, because functions of an electrical device are increasingly powerful, signal transmission requirements of an electrical connector are increasingly high. To make a cable connector to have a greater data transmission broadband and have a capability of transmitting uncompressed audio signals and high-resolution video signals, a chip is usually mounted on the circuit board to enhance a decoding capability of the cable connector. However, the chip produces a large amount of heat during operation. If the heat cannot be discharged in time, the chip would fail due to an excessively high temperature, which destroys the cable connector and causes the whole electrical device to fail.

Therefore, a heretofore unaddressed need exists in the art to address the aforementioned deficiencies and inadequacies.

SUMMARY OF THE INVENTION

In one aspect, the present invention relates to an electrical device heat dissipation structure, where a temperature of a mating connector is reduced by blowing air to the cable connector by an air blowing device inside a casing.

In certain embodiments, an electrical device heat dissipation structure includes an air blowing device, a casing and a mating connector. The casing is provided with an air outlet, an electrical connector, and a power supply providing power to the air blowing device. The mating connector has a chip and electrically conducts the electrical connector. The air blowing device blows air to pass through the air outlet toward the mating connector, to quickly dissipate heat generated during work of the chip, so as to reduce the temperature of the mating connector.

In certain embodiments, an insertion opening is disposed at one side of the casing, the mating connector is connected to the electrical connector through the insertion opening in a insertion manner, the center line of the air outlets and the center line of the insertion opening intersect at one point, and the intersection point is located on the mating connector.

In certain embodiments, when viewing toward the casing along an insertion direction of the mating connector and the electrical connector, the mating connector at least shield part of the air outlets.

In certain embodiments, the electrical device heat dissipation structure further includes a main board fixed in the casing. The electrical connector is installed on the main board and located in the casing. The power supply is installed in the casing and provides power to the main board.

In certain embodiments, the electrical device heat dissipation structure further includes a main board fixed in the casing. The electrical connector is installed on an installation board. The installation board is electrically connected to the main board through a flexible printing board. The power supply is installed in the casing and provides power to the main board.

In certain embodiments, an air guide member is sleeved on the air blowing device. The air guide member is provided with an air blowing opening, and the air blowing opening directly faces the air outlets.

In certain embodiments, the air guide member has a mask portion covers the air blowing device. A top surface of the mask portion is disposed with multiple air inlets. The air blowing opening is formed by extending from one side of the mask portion toward the air outlets.

In certain embodiments, the multiple air inlets are symmetrically arranged in a circle relative to a center of the top surface of the mask portion, and widths of the air inlets gradually decrease toward a direction close to the center of the top surface of the mask portion.

In certain embodiments, the air blowing device is a fan, a number of the air inlets is the same as a number of blades of the air blowing device.

In certain embodiments, the mating connector includes a plug and a circuit board connected to the plug, and the chip is mounted on the circuit board.

In certain embodiments, an inner metal shell encloses the circuit board, a cable is soldered to the circuit board, a spring is sleeved on one end of the cable, one end of the spring extends a heat conductive portion to a direction close to the inner metal shell, and the heat conductive portion contacts an outer surface of the inner metal shell.

In certain embodiments, at least one protrusion is disposed on a surface of the inner metal shell, an outer metal shell encloses the inner metal shell, an inner surface of the outer metal shell contacts the protrusion, and an outer surface of the outer metal shell is provided with multiple slots.

In certain embodiments, when viewing toward the casing along an insertion direction of the mating connector and the electrical connector, the air outlets are partially exposed to the slots.

In certain embodiments, a barrier is disposed between every two adjacent slots, and viewing along a plug direction of the mating connector and the electrical connector, and toward the casing, at least two adjacent barriers shield a same slot.

In certain embodiments, a main board is fastened inside the casing, when viewing toward the casing along an insertion direction of the mating connector and the electrical connector, at least two adjacent barriers partially block the same one of the air outlets.

In another aspect, the present invention provides an electrical device heat dissipation structure. In certain embodiments, an electrical device heat dissipation structure includes an air blowing device, a casing, an electrical connector, and a mating connector. The casing is provided with an opening and a power supply providing power to the air blowing device, The electrical connector is exposed to the opening. The mating connector has a plug, a circuit board connected with the plug, and a chip disposed on the circuit board. The plug is connected to the electrical connector through the opening in a plugging manner. The air blowing device blows air through the opening to the mating connector, to quickly dissipate heat generated during work of the chip, so as to avoid temperature increase of the mating connector.

In certain embodiments, the opening includes a insertion opening and at least one air outlet around the insertion opening. The plug is plugged to the electrical connector through the insertion opening. The air blowing device blows are to the mating connector through the at least one air outlet.

In certain embodiments, a center line of the at least one air outlet intersect with a center line of the insertion opening, and the intersection point is located at the mating connector.

In certain embodiments, the electrical device heat dissipation structure further includes an inner metal shell enclosing the circuit board, and an outer metal shell enclosing the inner metal shell. The surface of the inner metal shell is provided with at least one protrusion. The inner surface of the outer metal shell is in contact with the at least one protrusions, and the outer surface of the outer metal shell is provided with at least one slot.

In certain embodiments, when viewing toward the casing along an insertion direction of the mating connector and the electrical connector, the opening is partially exposed to the at least one slot.

In certain embodiments, the inner metal shell encloses the circuit board, a cable is soldered to the circuit board, a spring is sleeved on one end of the cable, one end of the spring extends a heat conductive portion to a direction close to the inner metal shell, and the heat conductive portion contacts an outer surface of the inner metal shell.

Compared with the related art, certain embodiments of the present invention have the following beneficial advantages:

In this electrical device heat dissipation structure, because the air blowing device can blow cold air to the mating connector through the air outlet, the failure of the chip due to high temperature is avoided, the working stability of the mating connector is efficiently improved, and the reliability of the whole electrical device is enhanced.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
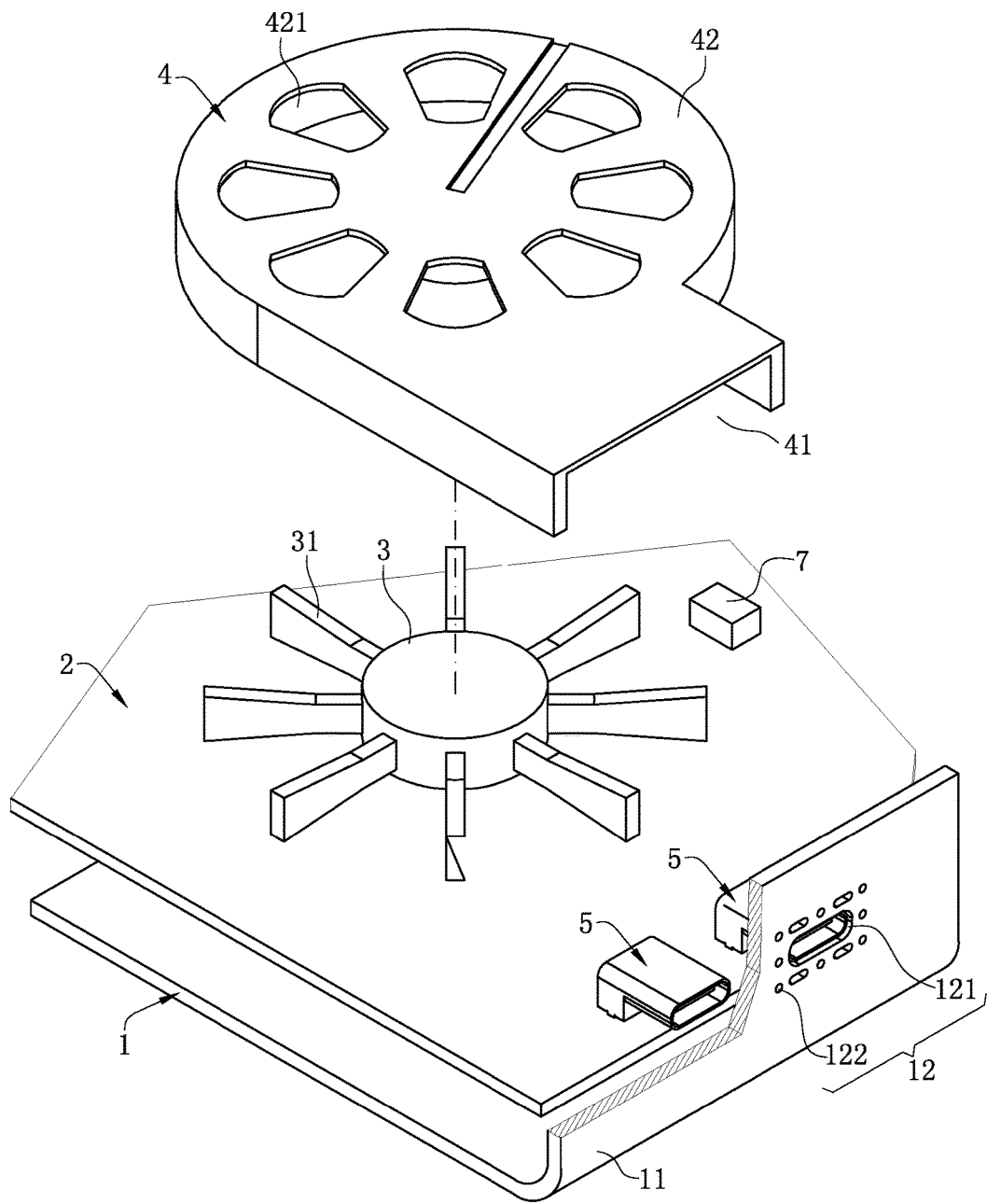
FIG. 1 is a schematic three-dimensional partial exploded view of an electrical device heat dissipation structure according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-10. In accordance with the purposes of this invention, as embodied and broadly described herein, this invention, in one aspect, relates to an electrical device heat dissipation structure.

Figure 2:
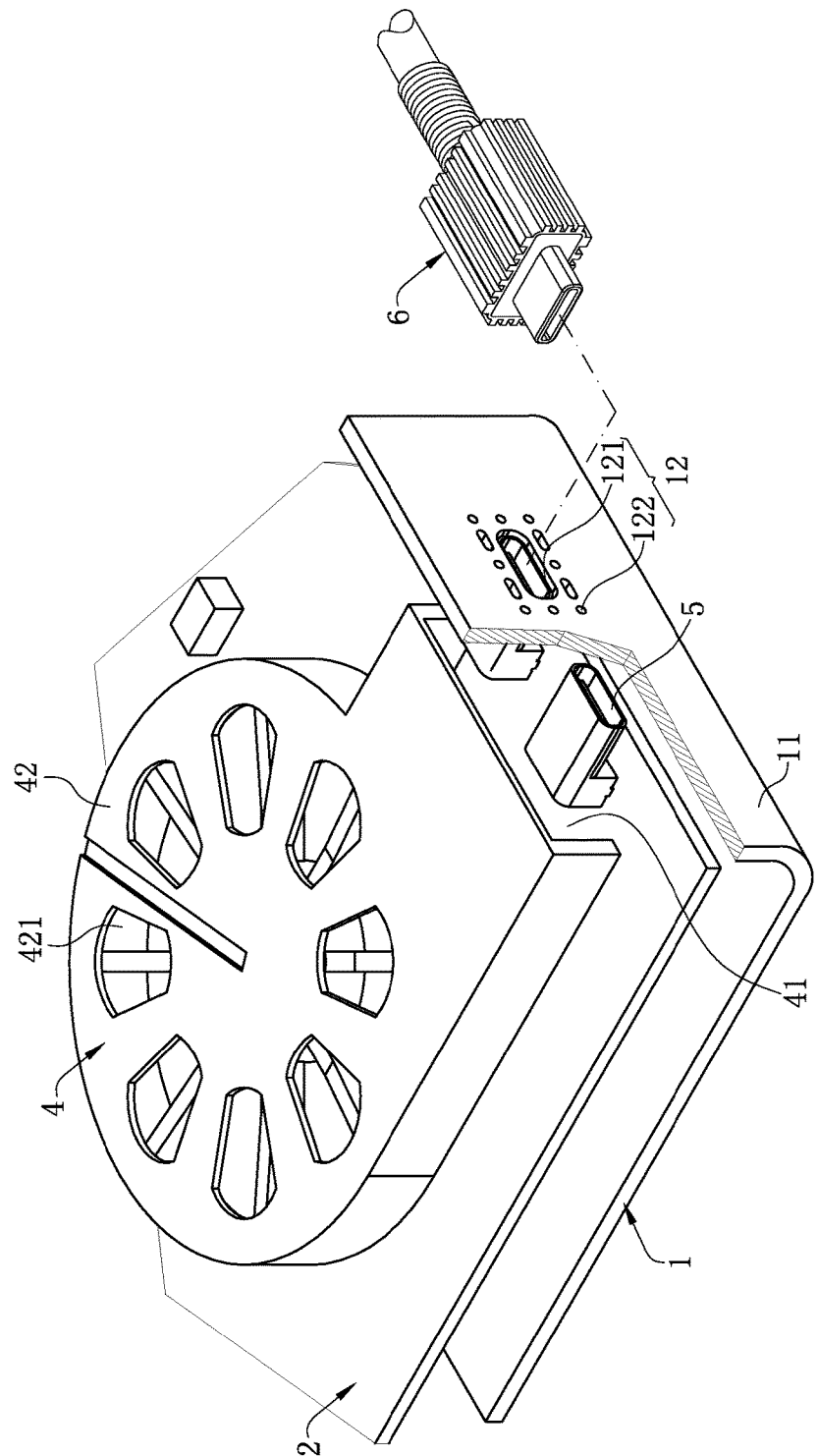
FIG. 2 is a schematic three-dimensional view of the first embodiment of the present invention.

As shown in FIGS. 1 and 2, an electrical device heat dissipation structure 100 of the present invention includes an casing 1, a main board 2 fixed inside the casing 1, an air blowing device 3 mounted on the main board 2, a power supply 7 disposed inside the casing 1 and providing power supply to the air blowing device 3 so that the air blowing device 3 is able to blow air, an air guide member 4 located inside the casing 1 and covered on the air blowing device 3, an electrical connector 5 accommodated in the casing 1 and electrically connected to the main board 2, and a mating connector 6 located outside the casing 1 and plug-connected to the electrical connector 5.

Figure 3:
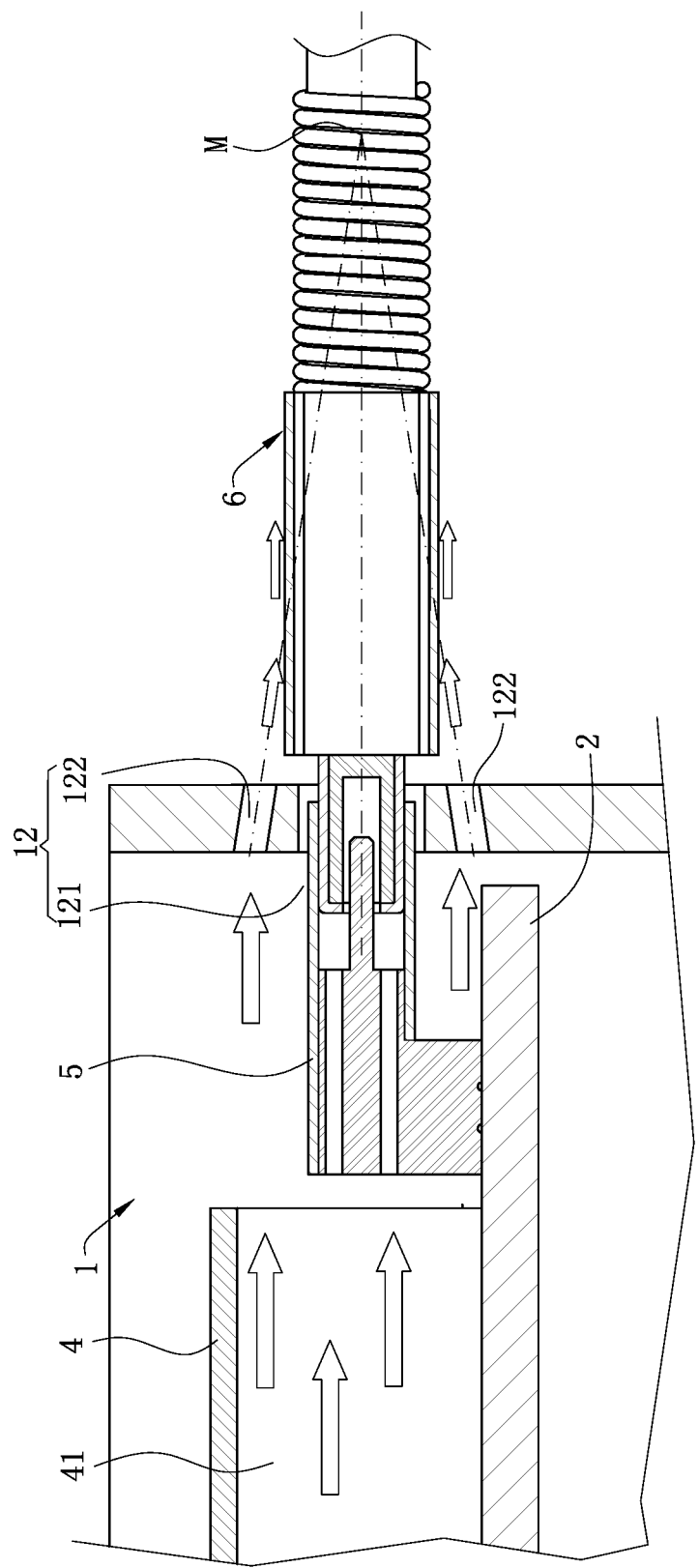
FIG. 3 is a partial sectional view of the first embodiment of the present invention.
Figure 4:
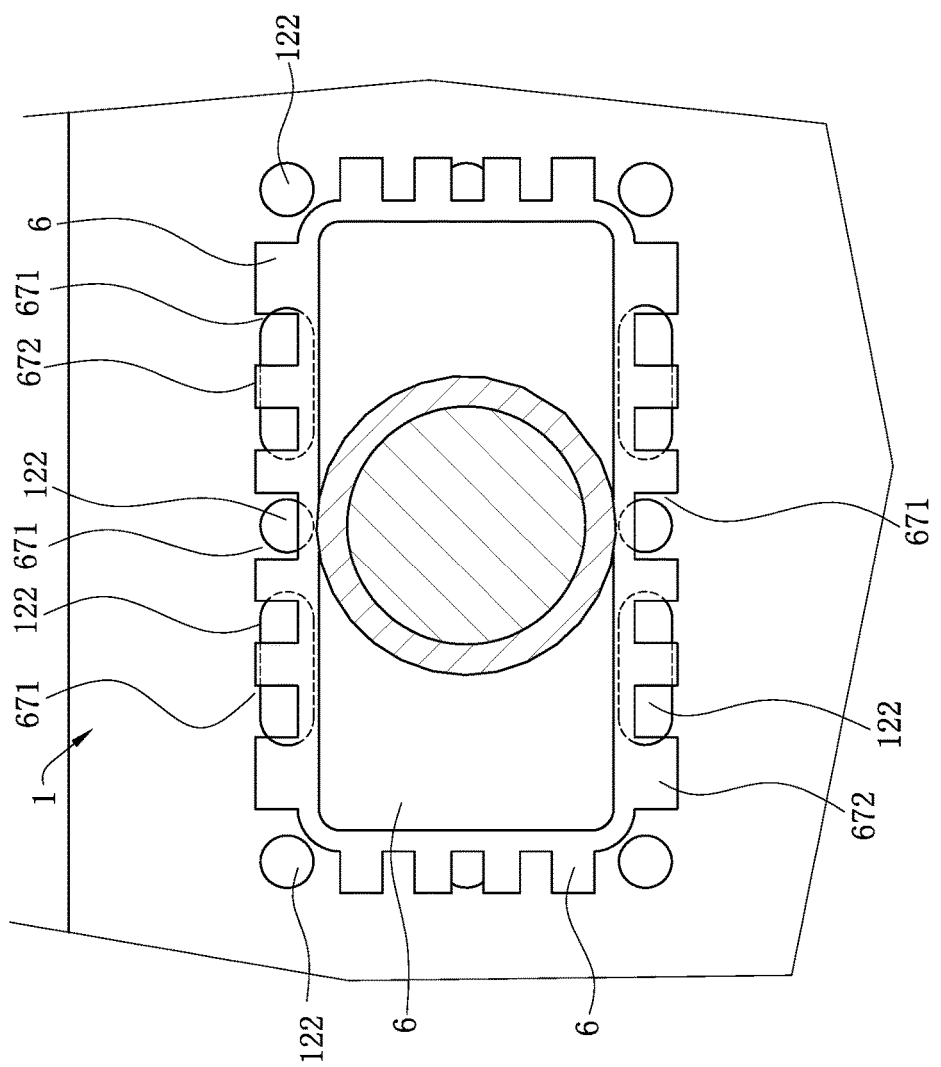
FIG. 4 is a front view of the first embodiment of the present invention viewing toward the insertion opening.
Figure 5:
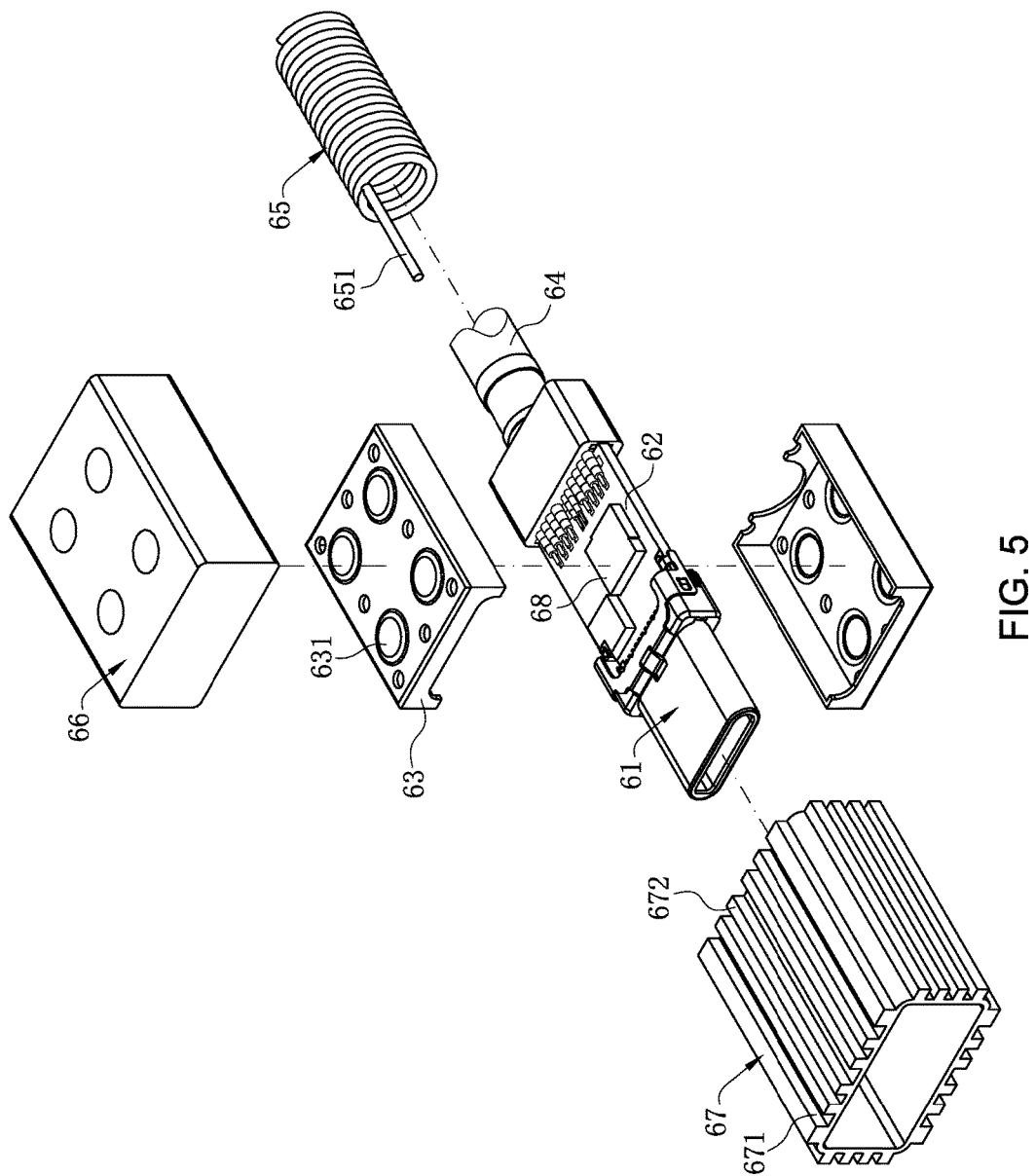
FIG. 5 is a schematic three-dimensional exploded view of a mating connector in the electrical device heat dissipation structure according to one embodiment of the present invention.
Figure 6:
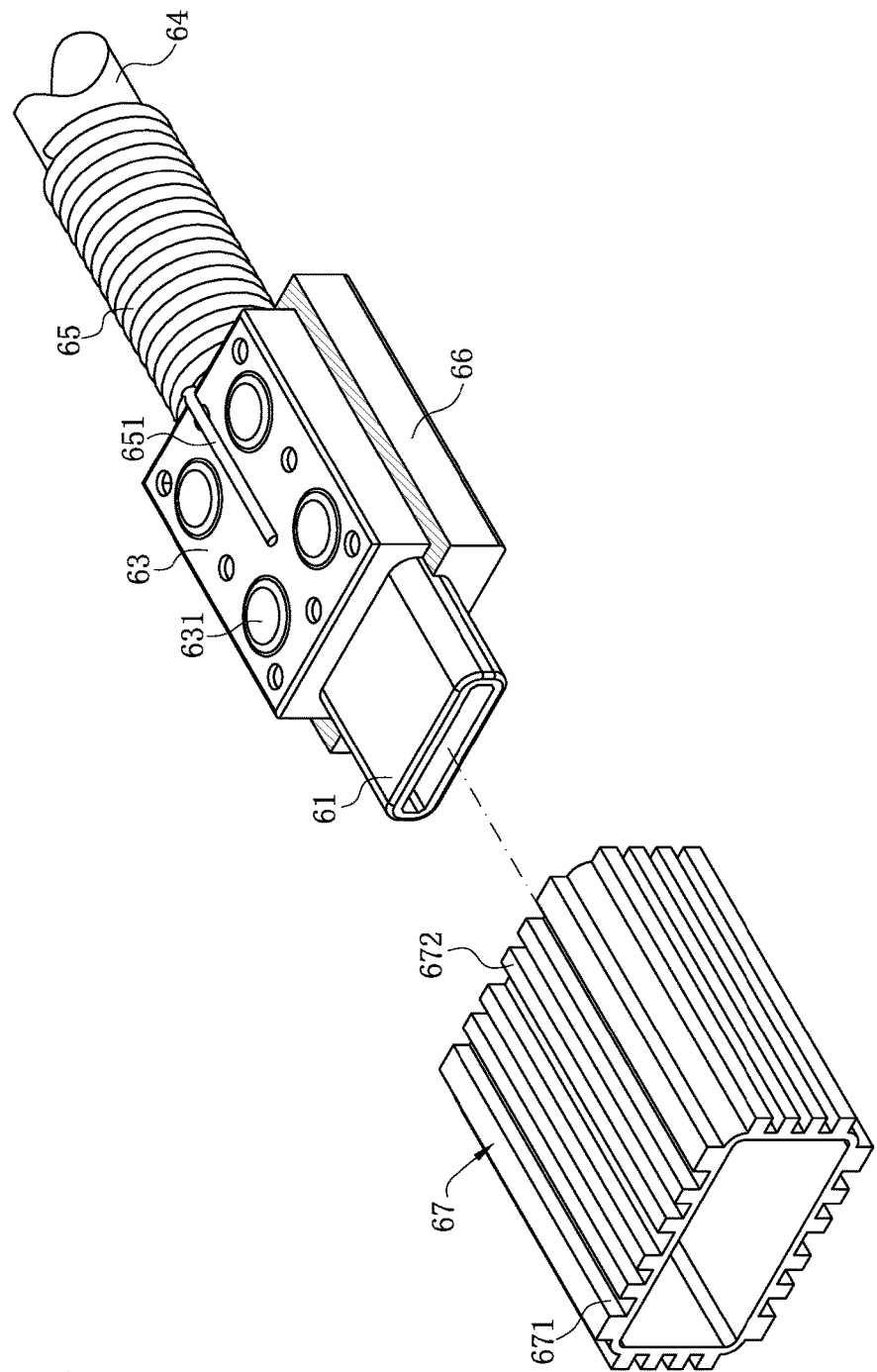
FIG. 6 is a three-dimensional view partial exploded view of the mating connector according to one embodiment of the present invention.

FIGS. 1-3 show a first embodiment of the electrical device heat dissipation structure 100 of the present invention. The casing 1 has a sidewall 11. An opening 12 is disposed on the sidewall 11. Each opening 12 includes a insertion opening 121 and multiple air outlets 122 located around the insertion opening 121. The electrical connector 5 is exposed at the insertion opening 121, so that the mating connector 6 may be plug-connected to the electrical connector 5 through the insert opening 121. The air guide member 4 has an air blowing opening 41. The air blowing opening 41 directly faces the air outlet 122, such that the air blowing device 3 can blow air to the mating connector 6 through the air outlet 122, so as to lower the temperature of the mating connector 6. To make air blown by the air blowing device 3 cover a maximum range of the mating connector 6 and accelerate a heat dissipation rate of the mating connector 6, in the side wall, the air outlets 122 are provided relatively tilted to the insertion opening 121, a center line of the air outlets 122 intersect with a central line of the inserting opening 121 at one point M, and the intersection point M is located on the mating connector 6. In this embodiment, the air blowing device 3 is a fan which is provided with eight fan blades 31, ensuring stability of the air blowing device 3 to a maximum degree. The air guide member 4 is provided with a circular mask portion 42 covered on the air blowing device 3. A top surface of the mask portion 42 is provided with eight air inlets 421, symmetrically arranged in a circle relative to a center of the top surface of the mask portion 42. Widths of the air inlets 421 gradually decrease to a direction close to the center of the mask portion 42. In this way, a number of the blades 31 of the air blowing device 3 is the same as a number of the air inlets 421, weak strength of the mask portion 42 caused by too many air inlets 421 is avoided, and reduced air quantity of the air outlets 122 due to too less number of air inlets 421 and too less of blowing air is avoided. In other embodiments, the number of the fan blades 31 and shapes, sizes, and the number of the air inlets 421 is not limited herein, as long as they satisfy an air volume required by the mating connector 6 for heat dissipation.

As shown in FIGS. 2, 4, 5, and 6, the mating connector 6 includes a plug 61, a circuit board 62, an inner metal shell 63, a cable 64, a spring 65, a plastic shell 66, and an outer metal shell 67. The plug 61 is plug-connected to the electrical connector 5 through the insertion opening 121. The circuit board 62 is electrically connected to the plug 61. The inner metal shell 63 encloses the circuit board 62. Four protrusions 631 are respectively disposed on each of an upper surface and a lower surface of the inner metal shell 63. The cable 64 is soldered on the circuit board 62. The spring 65 is sleeved on one end of the cable 64, to avoid bad contact with the circuit board 62 when the cable 64 is bent. Further, one end of the spring 65 extends a heat conductive portion 651 to a direction close to the inner metal shell 63. The heat conductive portion 651 contacts an outer surface of the inner metal shell 63 and transmits a part of heat on the inner metal shell 63 to the air, improving a heat dissipation capability and stability of the mating connector 6. The plastic shell 66 is injection molded outside the inner metal shell 6. The protrusions 631 are exposed at the plastic shell 66. The outer metal shell 67 encloses the plastic shell 66, and an inner surface of the outer metal shell 67 contacts the protrusions 631, so that heat from the inner metal shell 63 can be transmitted to the outer metal shell 67 through the protrusions 631, providing another path of heat dissipation to the mating connector 6. In addition, multiple slots 671 are disposed on an outer surface of the outer metal shell 67, increasing an outer surface area of the outer metal shell 67 and enhancing a heat dissipation capability of the outer metal shell 67. Along a plug direction of the mating connector 6 and the electrical connector 5, and viewing toward the casing 1, the air outlets 122 are partially exposed at the slots 671. Further, barriers 672 are disposed between adjacent slots 671. Along a plug direction of the mating connector 6 and the electrical connector 5, and viewing toward the casing 1, at least two adjacent barriers 672 shield a same air outlets 122, so that air blown from the air outlets 122 directly blows over the slots 671 and cools the outer metal shell 67. To enhance a signal transmission capability of the mating connector 6, a chip 68 is mounted on the circuit board. In this embodiment, the electrical connector 5 is a universal serial bus (USB) Type C female end capable of being plugged in dual orientation, and the mating connector 6 is a cable connector of a USB Type C male end. In other embodiments, types of the electrical connector 5 and the mating connector 6 can be randomly changed according to needs and are not limited herein.

Figure 7:
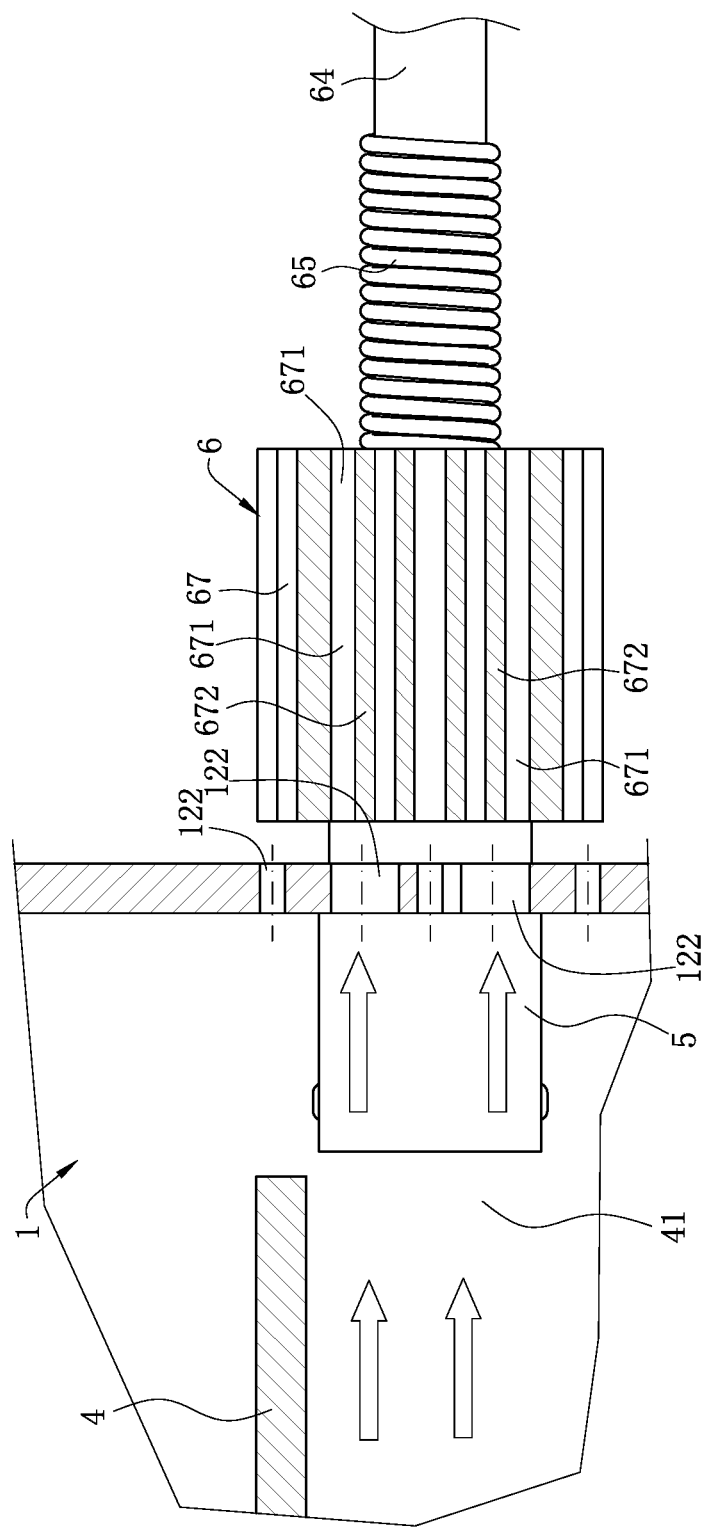
FIG. 7 is a top sectional view of an electrical device heat dissipation structure according to a second embodiment of the present invention.
Figure 8:
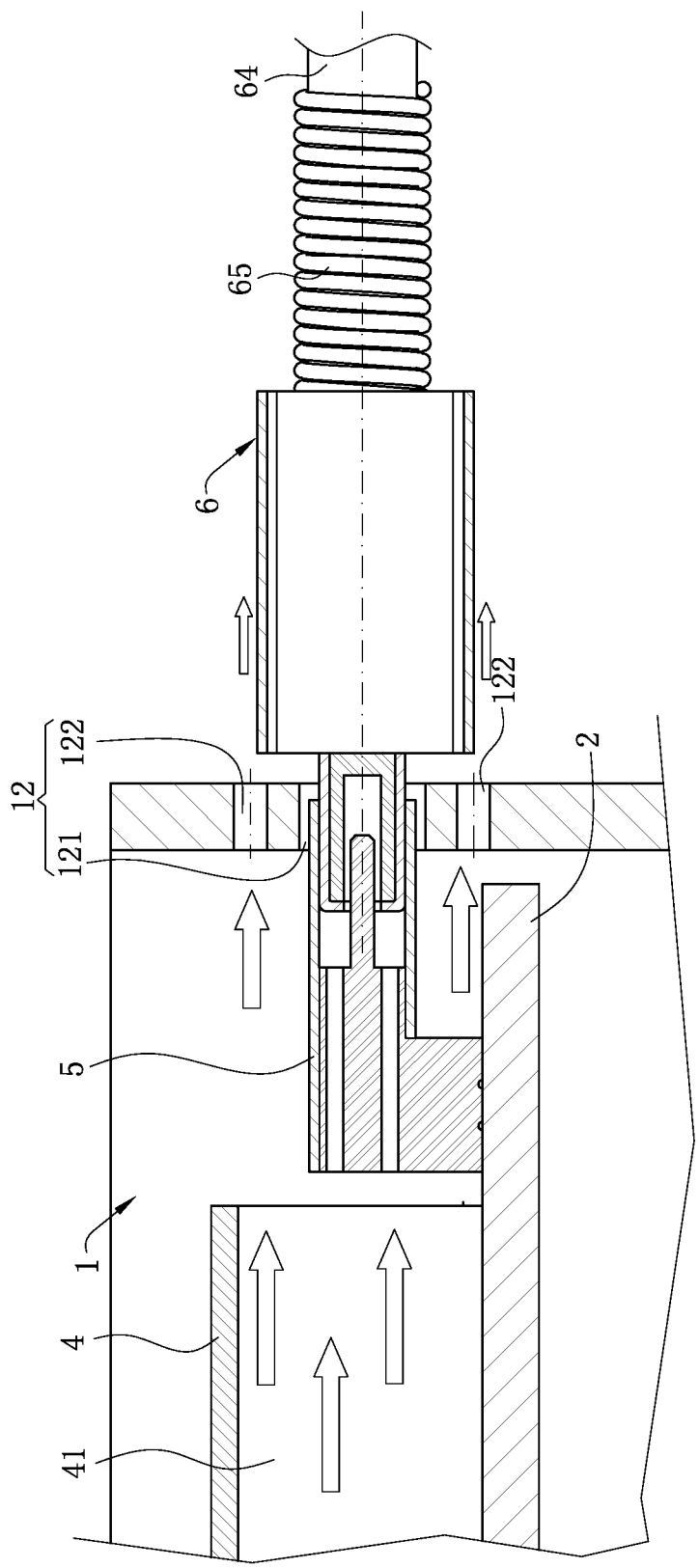
FIG. 8 is a front sectional view of the electrical device heat dissipation structure according to the second embodiment of the present invention.

FIGS. 7 and 8 show a second embodiment of the present invention. The second embodiment 2 fundamentally differs from the first embodiment 1 in that in this embodiment, the central line of the air outlets 122 is parallel to the central line of the insertion opening 121. However, along a plug direction of the mating connector 6 and the electrical connector 5, and viewing toward the casing 1, the mating connector 6 shields halves of areas of the air outlets 122. In this way, it can be ensured that the mating connector 6 is located on a path of blowing air from the air outlets 122, so that air blown from the air outlets 122 blows over the outer metal shell 67. In other embodiments, the mating connector 6 only needs to shield at least a portion of the air outlets 122, so that air blown from the air outlets 122 blows over the outer metal shell 67. Thus the structures and the locations of the air outlets 122 and the mating connector 6 are not limited to the embodiments of the present invention.

As shown in FIGS. 1 and 2, in a process of assembling the electrical device heat dissipation structure 100 according to one embodiment of the present invention, the main board 2 is first fixed to the casing 1, the electrical connector 5 is soldered to the main board 2, then the air blowing device 3 is mounted on the main board 2, the air guide member 4 is covered on the air blowing device 3, and at last, an upper cover of the casing 1 is closed, and the mating connector 6 is plugged to the electrical connector 5.

Figure 9:
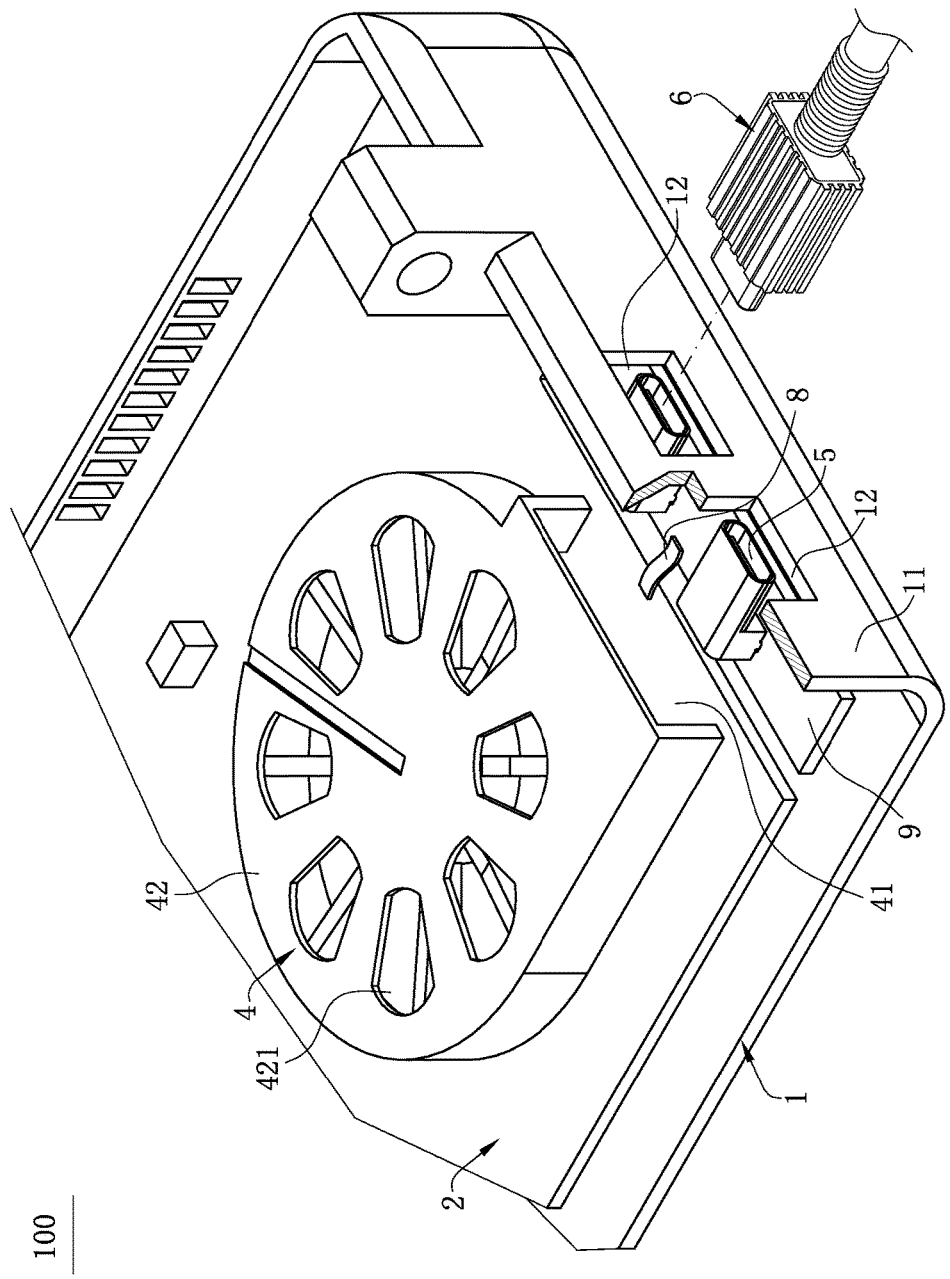
FIG. 9 is a partial three-dimensional view and a local sectional view of an electrical device heat dissipation structure according to a third embodiment of the present invention.
Figure 10:
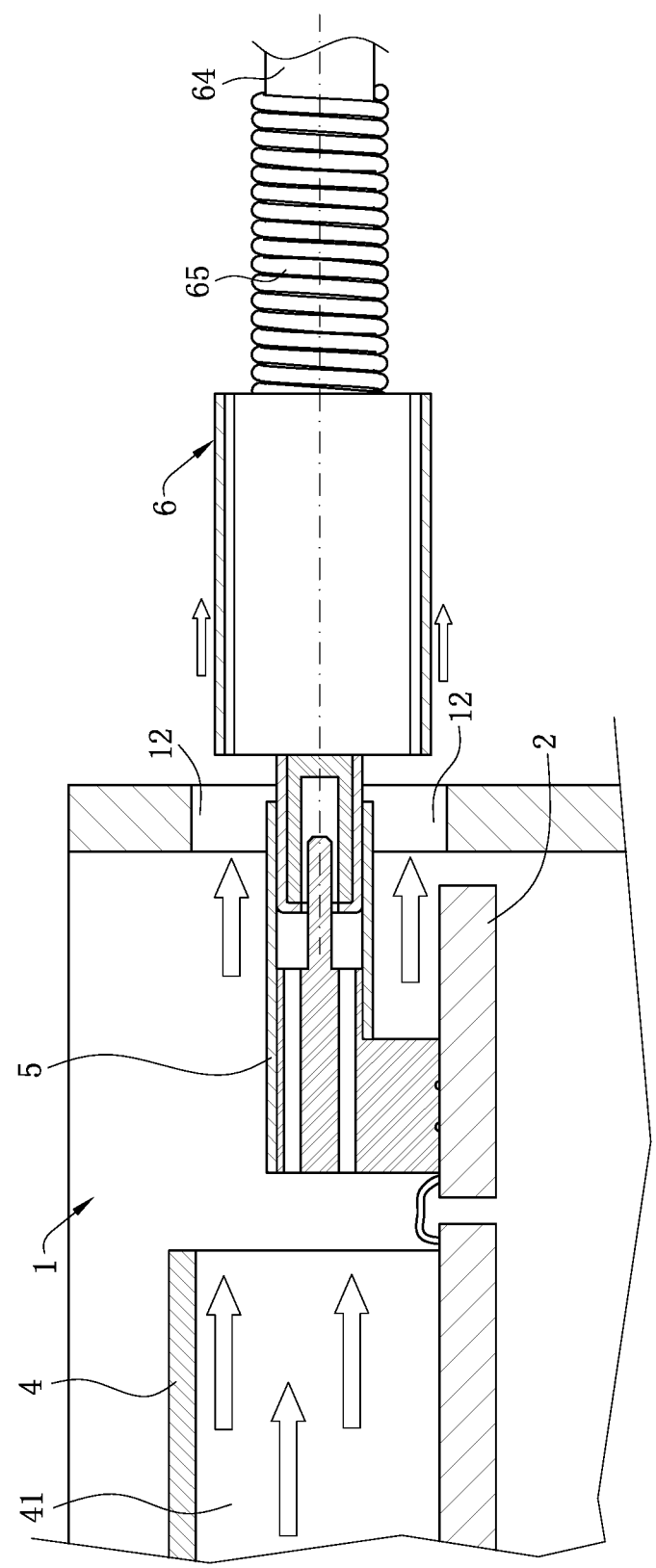
FIG. 10 is a sectional view of the electrical device heat dissipation structure according to the third embodiment of the present invention.

FIGS. 9 and 10 show a third embodiment of the present invention. The difference between the third embodiment and the first embodiment lies in that, in the third embodiment, the electrical connector 5 is installed on an installation board 9, the installation board 9 is connected to the main board 2 through the flexible printing board 8, the opening 12 is a larger through hole, such that after the electrical connector 5 and the mating connector 6 are plugged, the air blowing device 3 can blow the air through the opening 12 toward the mating connector 6 to lower the temperature of the mating connector 6, ensure normal performance of the chip, and also reduce the cost of the casing.

In summary, the electrical device heat dissipation structure 100 according to certain embodiments of the present invention has the following beneficial advantages:

(1) Multiple of the air outlets 122 are disposed around the insertion opening 122, so that the air blowing device 3 can blow air from the air outlets 122 to the mating connector 6, so as to lower temperature of the mating connector 6, avoid excessively high temperature of the chip 68, and improving an electrical transmission performance of the mating connector 6.

(2) The central lines of the air outlets 122 intersect with the central line of the insertion opening 121 at one point M, and the intersection point M is located on the mating connector 6, so that air blown from the heat dissipation holes 13 is blown to the mating connector 6 in an oriented manner, enhancing a heat dissipation effect.

(3) Along a plug direction of the mating connector 6 and the electrical connector 5, and viewing toward the casing 1, the mating connector 6 shields partially the air outlets 122, ensuring that the mating connector 6 is located on a path of blowing air from the air outlets 122, so that air blown from the air outlets 122 blows over the mating connector 6.

(4) The heat conductive portion 651 of the spring 65 contacts the inner metal shell 63, so that heat of the inner metal shell 63 can be dissipated through the spring 65, complementally enhancing a heat dissipation capability of the mating connector 6.

(5) The outer metal shell 67 contacts the inner metal shell 63 through the protrusions 631, providing another path of heat dissipation to the mating connector 6.

(6) The slots 671 are provided on the surface of the outer metal shell 67, which increase a heat dissipation area of the outer metal shell 67.

(7) The opening 12 is a large through hole, so that after the mating connector 6 is plugged into the electrical connector 5, the air blowing device 3 can blow the air to the mating connector 6 through the opening 12, so as to lower the temperature of the mating connector 6, ensure normal performance of the chip 68, and reduce cost of the casing 1.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical device heat dissipation structure, comprising:
   an air blowing device;
   a casing disposed with at least one air outlet, an electrical connector and a power supply, the power supply providing power to the air blowing device; and
   a mating connector having a chip, the mating connector electrically connected to the electrical connector, wherein the mating connector includes a plurality of slots and at least one barrier disposed between adjacent ones of the plurality of slots, and when viewed along a plug direction of the mating connector and the electrical connector, and toward the casing, the at least one barrier shields only partially the at least one air outlet,
   wherein the air blowing device is configured to blow air to the mating connector through the at least one air outlet, so as to improve dissipation of heat generated by the chip at work, and to reduce a temperature of the mating connector.

2. The electrical device heat dissipation structure of claim 1, further comprising a main board fixed in the casing, wherein the electrical connector is installed on the main board and located in the casing, and the power supply is installed in the casing and provides power supply to the main board.

3. The electrical device heat dissipation structure of claim 1, further comprising a main board fixed in the casing, wherein the electrical connector is installed on an installation board, the installation board is connected to the main board through a flexible printing board, and the power supply is installed in the casing and provides power supply to the main board.

4. The electrical device heat dissipation structure of claim 1, further comprising an air guide member covering the air blowing device, wherein the air guide member has an air blowing opening, and the air blowing opening directly faces the at least one air outlet.

5. The electrical device heat dissipation structure of claim 4, wherein the air guide member comprises mask portion that is circular, the mask portion covers on the air blowing device, a top surface of the mask portion is provided with at least one air inlet, the air blowing opening is formed by extending from a side of the mask portion toward the at least one air outlet.

6. The electrical device heat dissipation structure of claim 5, wherein the at least one air inlet comprises a plurality of air inlets, and the plurality of the air inlets are symmetrically arranged in a circle relative to a center of the top surface of the mask portion, and a width of each of the air inlets gradually decreases along a direction toward a center of the top surface of the mask portion.

7. The electrical device heat dissipation structure of claim 6, wherein the air blowing device is a fan, a number of the plurality of air inlets is a same as a number of blades of the fan.

8. The electrical device heat dissipation structure of claim 1, wherein the mating connector comprises a plug and a circuit board connected to the plug, and the chip is mounted to the circuit board.

9. The electrical device heat dissipation structure of claim 8, further comprising:
   an inner metal shell enclosing the circuit board;
   a cable soldered to the circuit board; and
   a spring sleeved on one end of the cable,
   wherein one end of the spring extends a heat conductive portion toward a direction close to the inner metal shell, and the heat conductive portion contacts an outer surface of the inner metal shell.

10. The electrical device heat dissipation structure of claim 9, wherein at least one protrusion is disposed on a surface of the inner metal shell, an outer metal shell encloses the inner metal shell, an inner surface of the outer metal shell is in contact with the at least one protrusion, and an outer surface of the outer metal shell is provided with the at least one slot.

11. The electrical device heat dissipation structure of claim 10, wherein when viewed along the plug direction of the mating connector and the electrical connector, and toward the casing, the at least one air outlet is partially exposed to the at least one slot.

12. The electrical device heat dissipation structure of claim 10, wherein the at least one barrier includes a plurality of barriers, and when viewed along the plug direction of the mating connector and the electrical connector, and toward the casing, at least adjacent two of the barriers shield a same one of the at least one air outlet.

13. An electrical device heat dissipation structure, comprising:
   an air blowing device;
   a casing disposed with at least one air outlet, an electrical connector, and a power supply, the power supply providing power to the air blowing device;
   a mating connector having a plug, a circuit board connected with the plug, a cable electrically connected to the circuit board, and a chip disposed on the circuit board, wherein the plug is configured to be plugged to the electrical connector along a plug direction of the mating connector and the electrical connector;
   an inner metal shell enclosing the circuit board;
   an outer metal shell enclosing the inner metal shell, wherein when viewed along a direction perpendicular to the plug direction of the mating connector and the electrical connector, and toward the casing, the outer metal shell shields only partially the at least one air outlet,
   wherein the air blowing device is configured to blow air to the mating connector through the at least one air outlet, so as to improve dissipation of heat generated by the chip at work, and to avoid a temperature increase of the mating connector.

14. The electrical device heat dissipation structure of claim 13, wherein the casing further includes an insertion opening and the at least one air outlet disposed at a location around the insertion opening, and the plug is inserted to the electrical connector through the insertion opening, and the air blowing device blows the air to the mating connector through the at least one air outlet.

15. The electrical device heat dissipation structure of claim 13, wherein at least one protrusion is disposed on a surface of the inner metal shell, and an inner surface of the outer metal shell is in contact with the at least one protrusion.

16. The electrical device heat dissipation structure of claim 13, further comprising:
   a spring sleeved on one end of the cable,
   wherein one end of the spring extends a heat conductive portion toward a direction close to the inner metal shell, and the heat conductive portion contacts an outer surface of the inner metal shell.

17. The electrical device heat dissipation structure of claim 13, wherein the mating connector includes a plurality of slots and at least one barrier disposed between adjacent ones of the plurality of slots, and when viewed along the plug direction of the mating connector and the electrical connector, and toward the casing, the at least one barrier shields only partially the at least one air outlet.

18. An electrical device heat dissipation structure, comprising:
   an air blowing device;
   a casing disposed with an insertion opening and at least one air outlet at one side of the casing, an electrical connector and a power supply, the power supply providing power to the air blowing device;
   a mating connector having a plug, a circuit board connected with the plug, a chip disposed on the circuit board, wherein the plug is configured to be plugged to the electrical connector through the insertion opening to be electrically connected to the electrical connector;
   an inner metal shell enclosing the circuit board; and
   an outer metal shell enclosing the inner metal shell, wherein the plug is located outside the outer metal shell, and a center line of the at least one air outlet intersect with an outer surface of the outer metal shell,
   wherein the air blowing device is configured to blow air to the mating connector through the at least one air outlet, so as to improve dissipation of heat generated by the chip at work, and to reduce a temperature of the mating connector.

19. The electrical device heat dissipation structure of claim 18, wherein the center line of the at least one air outlet intersect with a center line of the insertion opening at an intersection point, and the intersection point is located at the mating connector.

* * * * *